(12) United States Patent
Schmitz et al.

(10) Patent No.: US 11,092,636 B2
(45) Date of Patent: Aug. 17, 2021

(54) MEASUREMENT SYSTEM AND METHOD OF MEASURING A SIGNAL

(71) Applicant: Rohde & Schwarz GmbH & Co. KG, Munich (DE)

(72) Inventors: Sebastian Schmitz, Munich (DE); Sijia Gu, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 15 days.

(21) Appl. No.: 16/662,850

(22) Filed: Oct. 24, 2019

(65) Prior Publication Data

US 2021/0123961 A1    Apr. 29, 2021

(51) Int. Cl.
*G01R 27/28* (2006.01)
*G01R 29/10* (2006.01)

(52) U.S. Cl.
CPC .................. *G01R 29/105* (2013.01)

(58) Field of Classification Search
CPC ... G01R 29/10; G01R 29/105; G01R 29/0814
See application file for complete search history.

(56) References Cited

U.S. PATENT DOCUMENTS

| | | | |
|---|---|---|---|
| 2010/0171669 A1* | 7/2010 | Ito | G01R 29/10 343/703 |
| 2011/0043418 A1 | 2/2011 | Teshirogi et al. | |
| 2013/0257454 A1* | 10/2013 | Mow | H01Q 5/328 324/619 |
| 2013/0281036 A1* | 10/2013 | Kolokotronis | H04B 17/101 455/115.1 |
| 2015/0358337 A1* | 12/2015 | Keller | G06F 11/00 726/23 |
| 2018/0254840 A1* | 9/2018 | Foegelle | H04B 17/3912 |
| 2018/0337738 A1* | 11/2018 | Wen | H04B 17/12 |
| 2019/0229817 A1 | 7/2019 | Axmon et al. | |

* cited by examiner

*Primary Examiner* — Thang X Le
(74) *Attorney, Agent, or Firm* — Christensen O'Connor Johnson Kindness PLLC

(57) ABSTRACT

A measurement system comprising an anechoic space, a measurement antenna, a device under test, a spectrum analyzer, and a power sensor. The device under test transmits a signal. The measurement antenna measures the signal transmitted by the device under test. The signal measured by the measurement antenna is forwarded at least partly to the power sensor. The power sensor triggers the spectrum analyzer to perform a measurement. Further, a method of measuring a signal is described.

20 Claims, 2 Drawing Sheets

MEASUREMENT SYSTEM AND METHOD OF MEASURING A SIGNAL

FIELD OF THE DISCLOSURE

Embodiments of the present disclosure relate generally to a measurement system. Further, embodiments of the present disclosure relate generally to a method of measuring a signal.

BACKGROUND

In the state of the art, method and measurement systems are known for performing totally radiated power (TRP) tests on a device under test by measuring a certain signal over a three-dimensional sphere around the device under test that emits a respective signal to be measured in order to evaluate the over-the-air characteristics of the device under test. However, the test procedures known in the state of the art require a relative long measurement time, for instance 10 hours, in order to measure the different measurement points on the three-dimensional sphere around the device under test. In fact, it is necessary to stop at every spatial measurement point on the three-dimensional sphere and to demodulate the respective signal in order to measure the respective power of the signal yielding in a duration of about 10 hours.

In US 2019/0229817 A1, a method and a system are described that use a reduced sampling grid, namely a reduced number of measurement points on the three-dimensional sphere, in order to reduce the measurement time when performing the respective measurement.

However, the systems and methods known are only applicable for signals, particularly time division duplex (TDD) frame signals, having a low frequency and bandwidth, particularly a frequency lower than 6 GHz. Such signals are also known as 5G NR FR1 signals wherein Frequency Range 1 (FR1) includes sub-6 GHz frequency bands. In addition, the time division duplex frame configuration of the respective signals has to be redefined in a purely uplink or downlink configuration in order to be accepted, for instance by 3GPP for 5G NR FR1 signals.

However, none of the systems and methods known so far are applicable for signals with higher frequencies and bandwidths, for instance signals having a frequency higher than 20 GHz, particularly between 26 and 39 GHz. Those signals are also called 5G NR FR2 signals wherein Frequency Range 2 (FR2) includes frequency bands from 24.25 GHz to 52.6 GHz.

Accordingly, there is a need for a possibility to measure a signal with higher frequencies and bandwidths in a fast manner in a spherical measurement environment.

SUMMARY

Embodiments of the present disclosure provide a measurement system that comprises an anechoic space, a measurement antenna, a device under test, a spectrum analyzer as well as a power sensor. The device under test is configured to transmit a signal. The measurement antenna is configured to measure the signal transmitted by the device under test. The signal measured by the measurement antenna is forwarded at least partly to the power sensor. The power sensor is configured to trigger the spectrum analyzer to perform a measurement.

Further, embodiments of the present disclosure relate to a method of measuring a signal. The method comprises the steps of: transmitting a signal via a device under test; receiving and measuring the signal transmitted by a measurement antenna; forwarding the measured signal at least partly to a spectrum analyzer and a power sensor, respectively; and triggering the spectrum analyzer by the power sensor to perform a measurement.

Accordingly, accurate measurements of a signal with high frequency, large bandwidth and low integrated power can be performed by the measurement system and the respective method. Typically, a spectrum analyzer is not capable of capturing signals below a certain power level. However, the power sensor provided is sensitive for signals having a power below the certain power level of the spectrum analyzer. Therefore, the power sensor is used to trigger the spectrum analyzer to perform the measurement even though the spectrum analyzer itself does not recognize or rather sense the signal since the threshold power level is not exceeded by the signal. Accordingly, the sensitivity of the spectrum analyzer is (indirectly) improved by the external power sensor interacting with the spectrum analyzer. Accordingly, accurate measurements of the signal are ensured in order to retrieve power and performance values with a high measurement speed. For instance, the measurement time is reduced to approximately 5 minutes. In contrast to former measurement systems and methods, it is no longer necessary to stop at every measurement point and to demodulate the respective signal in order to measure the respective power of the signal.

Generally, the respective measurement can be performed for signals over a bandwidth of up to 400 MHz or even 800 MHz wherein the spectrum analyzer is triggered by the power sensor.

Put differently, a time division duplex (TDD) signal is emitted in a 5G NR mode of a device under test. For measuring the TDD signal by means of the spectrum analyzer, particularly the respective signal burst(s), a trigger is provided by the power sensor enabling the spectrum analyzer to capture the signal (burst).

A totally radiated power (TRP) test may be performed by the measurement system and the method wherein the respective measurement system as well as the method work for signals having a frequency lower than 6 GHz as well as for signals having a frequency up to 43 GHz. Those signals are called FR1 as well as FR2 signals, for example non-standalone (NSA) signals.

Generally, the measurement systems correspond to over-the-air (OTA) measurement systems, particularly for millimeter-wave testing, namely testing 5G NR devices and systems.

An aspect provides that a power divider is provided that is connected with the measurement antenna and the power sensor. The power divider is configured to split the signal measured into a first split measured signal and a second split measured signal. The power divider is further configured to forward the first and second split measured signals to the spectrum analyzer and the power sensor, respectively. Put differently, the measured signal is split into a first split measured signal and a second measured signal by a power divider. The power divider forwards the first and second split measured signals to the spectrum analyzer and the power sensor, respectively. Accordingly, the power sensor as well as the spectrum analyzer both receive the split measured signals from the power divider that is connected with the measurement antenna that receives the signal transmitted by the device under test.

Another aspect provides that an additional horn antenna is provided that is orientated towards the device under test and connected with the power sensor. In other words, the signal transmitted is additionally measured by a horn antenna that is orientated towards the device under test and connected with the power sensor. The horn antenna may be located at a fixture that is placed next to the device under test during its testing. Hence, an additional horn antenna is fixed close to the DUT and receives the signal transmitted from the device under test. The horn antenna is connected to the power sensor which will provide the trigger for the spectrum analyzer. The spectrum analyzer is connected with the measurement antenna. Hence, an external trigger by means of the separately formed or additional horn antenna is provided ensuring that the measurement can be triggered even though the power level of the signal transmitted is lower than the threshold power level of the spectrum analyzer.

According to another aspect, the device under test is configured to transmit a wide bandwidth signal. The signal may have a bandwidth up to 800 MHz that can be processed by the measurement system, for example the spectrum analyzer, due to the additional power sensor used for sensing relative low signal power levels and triggering the spectrum analyzer appropriately.

Another aspect provides that the device under test is configured to transmit a time division duplex signal. Thus, the device under test transmits a TDD signal, particularly a 5G-NR TDD signal, having a frequency up to 43 GHz. Such a signal relates to a so-called 5G-NR FR2 signal.

According to a further aspect, the spectrum analyzer performs an integrated channel power measurement. Thus, the power contained within a channel bandwidth can be determined appropriately.

According to another aspect, the spectrum analyzer is configured to perform an adjacent channel leakage ratio measurement. The adjacent channel leakage ratio (ACLR) measurement is used to measure the relative power within a certain offset range from a respective channel, for example an uplink channel. The offset ranges may relate to ±5 MHz and/or ±10 MHz. ACLR relates to the ratio of the filtered mean power centered on the respective channel frequency, namely the one of the main channel, to the filtered mean power centered on an adjacent channel frequency. Accordingly, the mean power for the respective channel frequencies are measured previously in order to determine the ACLR.

The measurement antenna may be configured to measure the signal transmitted by the device under test over a three-dimensional sphere. Hence, different measurement points on a grid defined by a three-dimensional sphere are taken into account when measuring the respective signal transmitted by the device under test. Thus, the performance characteristics of the device under test can be verified in an appropriate manner since properties on a sphere around the device under test are determined.

Typically, the signal strength varies over the surface of the three-dimensional sphere. Hence, totally radiated power (TRP) measurements may be performed.

In some embodiments, the measurement system comprises a three-dimensional positioner. The three-dimensional positioner ensures that the measurement antenna is enabled to measure the signal transmitted over a three-dimensional sphere around the device under test.

For instance, at least one of the measurement antenna and the device under test are assigned to the three-dimensional positioner. The three-dimensional positioner may comprise at least two different components wherein the different components are assigned to the measurement antenna and the device under test.

The entire three-dimensional positioner ensures, for example, that the measurement antenna and the device under test can be moved with respect to each other such that measurement points on a three-dimensional sphere about the device under test can be measured.

Another aspect provides that a power amplifier is provided that is connected to the power sensor. The power amplifier is located upstream of the power sensor. For instance, the power amplifier is arranged between the power divider and the power sensor. The power amplifier is used to increase a signal to noise ratio (SNR) in order to improve the trigger functionality provided by the power sensor. Hence, a signal with low signal power level is amplified by the power amplifier in order to ensure that the power sensor is enabled to sense the respective signal and to trigger the spectrum analyzer.

Furthermore, the power sensor may be established by a diode sensor with a trigger output. The diode sensor may relate to a three-path diode power sensor, for instance a so-called NRPxS power sensor by Rohde & Schwarz.

Another aspect provides that the measurement system comprises a control module. The control module may have a processor on which an AMS32 software and/or Contest software runs that can be used to perform the respective measurements. The AMS32 software or rather the associated measurement system may be used for pattern test(s). The Contest software or rather the associated measurement system may be used for 3GPP test cases.

Furthermore, the measurement antenna and the device under test may be located in the anechoic space. Thus, interfering signals as well as other disturbing influences can be avoided in an appropriate manner For instance, the anechoic space is established by an anechoic chamber. The anechoic chamber comprises a housing that limits the anechoic space in which the device under test and the measurement antenna are placed for performing the respective measurement.

Generally, the measurement system relates to a wireless communication test and/or measurement system.

In some embodiments, the measurement antenna is moved relative to the device under test along a three-dimensional sphere. As already discussed, the measurement antenna and/or the device under test may be moved with respect to each other in order to ensure that the different measurement points on the measurement grid of the three-dimensional measurement sphere are reached.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
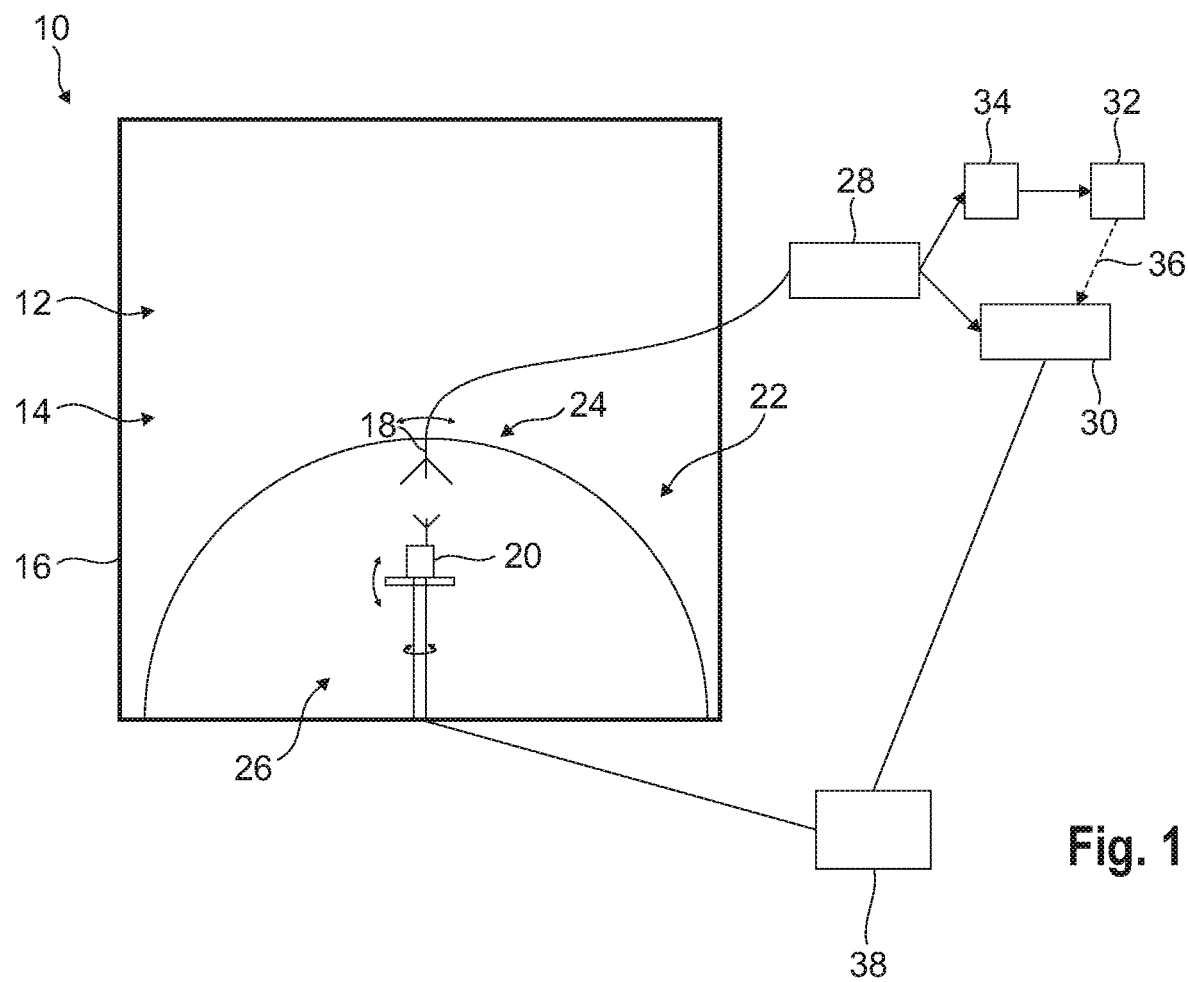
FIG. 1 shows a schematic overview of a representative measurement system according to the present disclosure.

In FIG. 1, a measurement system 10 is shown that comprises an anechoic space 12 that is provided by an anechoic chamber 14 having a housing 16 that limits the anechoic space 12. The measurement system 10 further comprises a measurement antenna 18 as well as a device under test 20 which both are located within the anechoic space 12.

In the shown embodiment, the measurement system 10 has a three-dimensional positioner 22 that comprises a first component 24 assigned to the measurement antenna 18 as well as a second component 26 assigned to the device under test 20. However, the three-dimensional positioner 22 may also be assigned to the measurement antenna 18 or the device under test 20 in order to move the measurement antenna 18 with respect to the device under test 20 or vice versa.

As shown in FIG. 1, the measurement antenna 18 and/or the device under test 20 may be moved, turned and/or swiveled by the three-dimensional positioner 22, particularly the respective components 24, 26. The three-dimensional positioner 22 generally ensures that the measurement antenna 18 and the device under test 20 can be moved with respect to each other such that the measurement antenna 18 is enabled to measure a signal transmitted by the device under test 20 over a three-dimensional sphere as will be described later with reference to FIG. 2. Hence, the measurement system 10 relates to a spherical measurement system. Furthermore, the measurement system 10 comprises a power divider 28 that is connected with the measurement antenna 18 and a spectrum analyzer 30 as well as a power sensor 32. The power divider 28 has an input assigned to the measurement antenna 18 as well as two outputs assigned to the spectrum analyzer 30 and the power sensor 32. Accordingly, the power divider 28 divides or rather splits the signal received from the measurement antenna 18 wherein the split signals are forwarded to the spectrum analyzer 30 and the power sensor 32.

In the shown embodiment, the measurement system 10 further comprises a power amplifier 34 that is arranged between the power divider 28 and the power sensor 32 in order to amplify the split signal forwarded to the power sensor 32.

Figure 2:
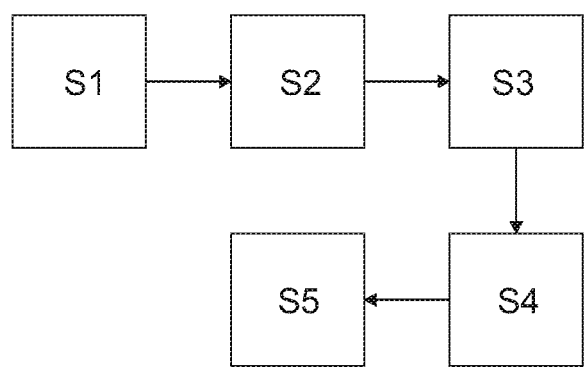
FIG. 2 shows a flow-chart illustrating a representative method of measuring a signal according to the present disclosure.

Moreover, the power sensor 32 and the spectrum analyzer 30 are connected with each other via a trigger line 36 via which the power sensor 32 can trigger the spectrum analyzer 30 as will be described hereinafter with reference to FIG. 2 showing a flow-chart that illustrates a method of measuring a signal while using the measurement system 10 shown in FIG. 1.

For controlling the respective components of the measurement system 10, for example the three-dimensional positioner 22, the device under test 20, and/or gathering measurement results from the spectrum analyzer 30, a control module 38 is provided. The control module 38 includes, for example, digital circuitry, a processor, etc., on which an AMS32 software and/or Contest software runs that can be used to perform the respective measurements.

In a first step S1, the device under test 20 transmits a signal. In a second step S2, the measurement antenna 18 measures the signal transmitted by the device under test 20.

While measuring the signal transmitted by the device under test 20, the measurement antenna 18 and/or the device under test 20 can be moved with respect to each other by the three-dimensional positioner 22 such that the measurement antenna 18, also called measurement probe, measures the signal transmitted by the device under test 20 over a three-dimensional sphere. In an embodiment, the three-dimensional positioner 22 is configured to move the measurement antenna 18 and/or the device under test 20 in the directions, patterns, etc., indicated by the arrows in FIG. 1.

In a third step S3, the signal measured by the measurement antenna 18 is forwarded to the power divider 28 that splits the signal measured into a first split measured signal and a second split measured signal.

In a fourth step S4, the respective split measured signals are forwarded to the spectrum analyzer 30 and the power sensor 32 wherein the second split measured signal that is forwarded to the power sensor 32 is amplified by the power amplifier 34. It is to be noted that the power amplifier 34 is only optional.

In an embodiment, the power sensor 32 may have a threshold level between −38 dBm and 23 dBm. If the power of the second split measured signal is lower than −38 dBm, the respective signal may be amplified by the power amplifier 34.

In a fifth step S5, the power sensor 32 sensing the respective signal received triggers the spectrum analyzer 30 via the trigger line 36 to perform a measurement.

Hence, the spectrum analyzer 30 performs a measurement even though the respective signal emitted by the device under test 20 has a power level that is lower than the threshold level of the spectrum analyzer 30.

In some embodiments, the device under test 20 transmits a wide bandwidth signal having a bandwidth higher than 50 MHz, for example a bandwidth of 100 MHz or larger. Specifically, the device under test 20 transmits a time division duplex signal (TDD signal), for instance a 5G NR FR2 signal.

During the respective measurement of the signal transmitted by the device under test 20, the spectrum analyzer 30 performs an integrated channel power measurement and an adjacent channel leakage ratio measurement (ACLR measurement).

Figure 3:
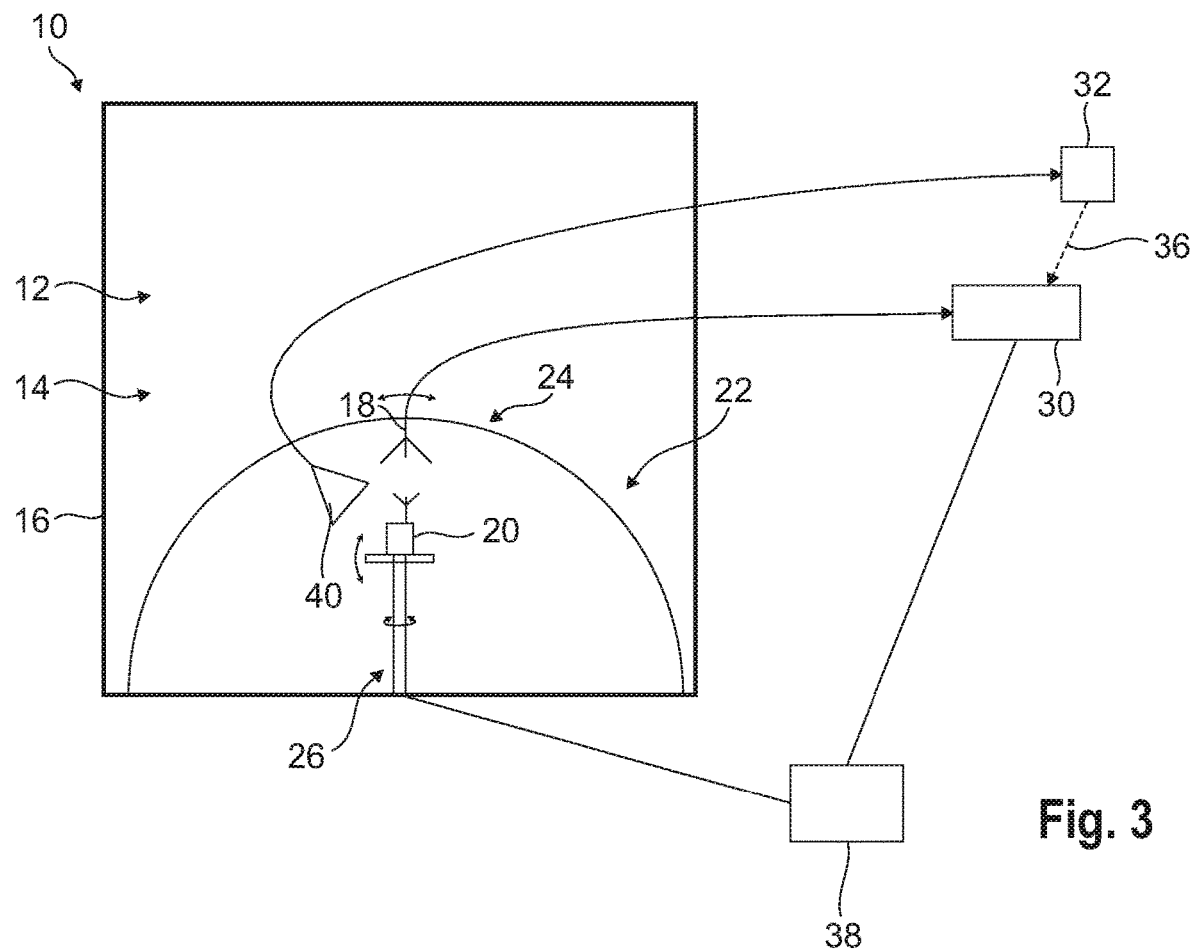
FIG. 3 shows another schematic overview of another measurement system according to the present disclosure.

In FIG. 3, another measurement system 10 is shown that comprises an additional horn antenna 40 instead of the power divider 28. The horn antenna 40 is located at a fixture that is positioned close to the device under test 20. The horn antenna 40 is connected with the power sensor 32 such that the signals received by the horn antenna 40 is forwarded to and processed by the power sensor 32 in order to trigger the spectrum analyzer 30.

The spectrum analyzer 30 itself is connected with the measurement antenna 18. However, the power level of the signal measured may be lower than the threshold level of the spectrum analyzer 30 so that the spectrum analyzer 30 itself cannot sense the signal transmitted and starting a respective measurement. Therefore, the external trigger is provided that is established by the horn antenna 40 and the power sensor 32.

The measurement system 10 shown in FIG. 3 can be used for the same purposes as the one shown in FIG. 1.

Generally, the power sensor 32 used by the measurement system 10 may be established by a diode sensor having a trigger output that is connected with the spectrum analyzer 30. The diode sensor may relate to a three-path power diode.

The measurement system 10 as well as the method described above ensure that 5G NR TDD frame signals with large bandwidth and low integrated power can be measured in an accurate and fast manner. It is no longer necessary to stop at every spatial measurement point on the three-dimensional sphere while demodulating the respective signal in order to measure the respective power.

The sensitivity of the spectrum analyzer 30 used by the measurement system 10 is improved by the additional power sensor 32. Typical spectrum analyzers 30 are not capable of capturing signals below a certain power level, also called threshold level, wherein this is compensated by the additional power sensor 32 triggering the spectrum analyzer 30.

The measurement system 10 as well as the method ensure that performance measurement quantities like ACLR and power can be measured accurately in a spherical environment. Moreover, this can be done in a fast manner The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system comprising:
    a spectrum analyzer;
    a power sensor;
    an anechoic space;
    a device under test, said device under test is configured to transmit a signal; and
    a measurement antenna configured to measure said signal transmitted by said device under test, said signal measured by said measurement antenna being forwarded at least partly to said power sensor,
    wherein said power sensor is configured to trigger said spectrum analyzer to perform a measurement.

2. The measurement system according to claim 1, wherein a power divider is provided that is connected with said measurement antenna and said power sensor, said power divider configured to split said signal measured into a first split measured signal and a second split measured signal, said power divider configured to forward said first and second split measured signals to said spectrum analyzer and said power sensor, respectively.

3. The measurement system according to claim 1, wherein an additional horn antenna is provided that is orientated towards said device under test and connected with said power sensor.

4. The measurement system according to claim 1, wherein said device under test transmits a wide bandwidth signal.

5. The measurement system according to claim 1, wherein said device under test transmits a time division duplex signal.

6. The measurement system according to claim 1, wherein said spectrum analyzer performs an integrated channel power measurement.

7. The measurement system according to claim 1, wherein said spectrum analyzer performs an adjacent channel leakage ratio measurement.

8. The measurement system according to claim 1, wherein said measurement antenna measures said signal transmitted by said device under test over a three-dimensional sphere.

9. The measurement system according to claim 1, wherein said measurement system comprises a three-dimensional positioner.

10. The measurement system according to claim 9, wherein at least one of said measurement antenna and said device under test is assigned to said three-dimensional positioner.

11. The measurement system according to claim 9, wherein said three-dimensional positioner is configured to trigger spatial predefined measurement points on said three-dimensional sphere.

12. The measurement system according to claim 1, wherein a power amplifier is provided that is connected to said power sensor.

13. The measurement system according to claim 1, wherein said power sensor is a diode sensor with a trigger output.

14. The measurement system according to claim 1, wherein said measurement system comprises a control module.

15. The measurement system according to claim 1, wherein said measurement antenna and said device under test are located in said anechoic space.

16. The measurement system according to claim 15, wherein the anechoic space is established by an anechoic chamber.

17. A method of measuring a signal, the method comprising:
    transmitting a signal via a device under test;
    receiving and measuring said signal transmitted by a measurement antenna;
    forwarding said measured signal at least partly to a spectrum analyzer and a power sensor, respectively; and
    triggering said spectrum analyzer by said power sensor to perform a measurement.

18. The method according to claim 17, wherein said measured signal is split into a first split measured signal and a second measured signal by means of a power divider, said power divider forwarding said first and second split measured signals to said spectrum analyzer and said power sensor, respectively.

19. The method according to claim 17, wherein said signal transmitted is additionally measured by a horn antenna that is orientated towards said device under test and connected with said power sensor.

20. The method according to claim 17, wherein said measurement antenna is moved with respect to said device under test along a three-dimensional sphere.

\* \* \* \* \*